(12) United States Patent
Cheng et al.

(10) Patent No.: US 12,376,435 B2
(45) Date of Patent: Jul. 29, 2025

(54) MICRO-LED APPARATUS WITH A SERIES OF CARBON-BASED LIGHT-EMITTING MATERIALS AND MANUFACTURING METHOD FOR ADJUSTING EMISSION COLORS

(71) Applicant: Oregon State University, Corvallis, OR (US)

(72) Inventors: Li-Jing Cheng, Corvallis, OR (US); Ye Liu, Corvallis, OR (US)

(73) Assignee: Oregon State University, Corvallis, OR (US)

( * ) Notice: Subject to any disclaimer, the term of this patent is extended or adjusted under 35 U.S.C. 154(b) by 851 days.

(21) Appl. No.: 17/648,419

(22) Filed: Jan. 19, 2022

(65) Prior Publication Data

US 2022/0231202 A1 Jul. 21, 2022

Related U.S. Application Data

(60) Provisional application No. 63/139,692, filed on Jan. 20, 2021.

(51) Int. Cl.
| | |
|---|---|
| *H10H 20/851* | (2025.01) |
| *C01B 32/166* | (2017.01) |
| *C09K 11/65* | (2006.01) |
| *H01L 25/075* | (2006.01) |
| *H10H 20/01* | (2025.01) |

(52) U.S. Cl.
CPC ....... *H10H 20/8512* (2025.01); *C01B 32/166* (2017.08); *C09K 11/65* (2013.01); *C01P 2004/64* (2013.01); *C01P 2006/60* (2013.01); *C01P 2006/80* (2013.01); *H01L 25/0753* (2013.01); *H10H 20/0361* (2025.01)

(58) Field of Classification Search
CPC .................................................. H10H 20/8512
See application file for complete search history.

(56) References Cited

FOREIGN PATENT DOCUMENTS

| | | | | |
|---|---|---|---|---|
| KR | 20150078108 | | 7/2015 | |
| WO | WO-2018188155 A1 | * | 10/2018 | ......... H01L 51/0097 |
| WO | WO-2020230810 A1 | * | 11/2020 | |

OTHER PUBLICATIONS

Chen et al., "Red-emissive carbon dots for fingerprints detection by spray method: coffee ring effect and unquenched fluorescence in drying process." ACS applied materials & interfaces 9.22 (2017): 18429-18433.

(Continued)

*Primary Examiner* — Joseph L Williams
(74) *Attorney, Agent, or Firm* — MUGHAL GAUDRY & FRANKLIN PC

(57) ABSTRACT

Disclosed herein are materials and a micro-LED display with carbon-based light-emitting materials, carbon quantum dots, that are made by a solvothermal synthesis of a mixture of aromatic amino acid, 3,4-dihydroxy-L-phenylalanine (LDOPA), and urea in dimethylformamide (DMF). The mixture is heated in a sealed pressure reactor at a temperature, ranging from 120 degrees Celsius to 350 degrees Celsius, for 4-24 hours. The product is then purified to collect the solid powder. The purified CDs can be dissolved in an acrylate monomer solution or a polymer solution for material delivery and curing process on a target substrate for the applications, including light-emitting devices or sensors.

12 Claims, 10 Drawing Sheets

(56) References Cited

OTHER PUBLICATIONS

Fanglong et al., "Engineering triangular carbon quantum dots with unprecedented narrow bandwidth emission for multicolored LEDs." Nature communications 9.1 (2018): 2249.

Jiang et al., "Red, green, and blue luminescence by carbon dots: full-color emission tuning and multicolor cellular imaging." Angewandte Chemie International Edition 54.18 (2015): 5360-5363.

Liu et al., "Red emission B, N, S-co-doped carbon dots for colorimetric and fluorescent dual mode detection of Fe3+ ions in complex biological fluids and living cells." ACS applied materials & interfaces 9.14 (2017): 12663-12672.

Miao et al., "Synthesis of carbon dots with multiple color emission by controlled graphitization and surface functionalization." Advanced Materials 30.1 (2018): 1704740.

Sun et al., "Toward high-efficient red emissive carbon dots: facile preparation, unique properties, and applications as multifunctional theranostic agents." Chemistry of Materials 28.23 (2016): 8659-8668.

Yuan et al., "Bright multicolor bandgap fluorescent carbon quantum dots for electroluminescent light-Emitting diodes." Advanced materials 29.3 (2017): 1604436.

Yuan et al., "Multicolor fluorescent graphene quantum dots colorimetrically responsive to all-pH and a wide temperature range." Nanoscale 7.27 (2015): 11727-11733.

Zhan et al., "A solvent-engineered molecule fusion strategy for rational synthesis of carbon quantum dots with multicolor bandgap fluorescence." Carbon 130 (2018): 153-163.

Zhu et al., "Emitting color tunable carbon dots by adjusting solvent towards light-emitting devices." Nanotechnology 29.8 (2018): 085705.

Zifei et al., "53% Efficient Red Emissive Carbon Quantum Dots for High Color Rendering and Stable Warm White- Light-Emitting Diodes." Advanced Materials 29.37 (2017): 1702910.

* cited by examiner

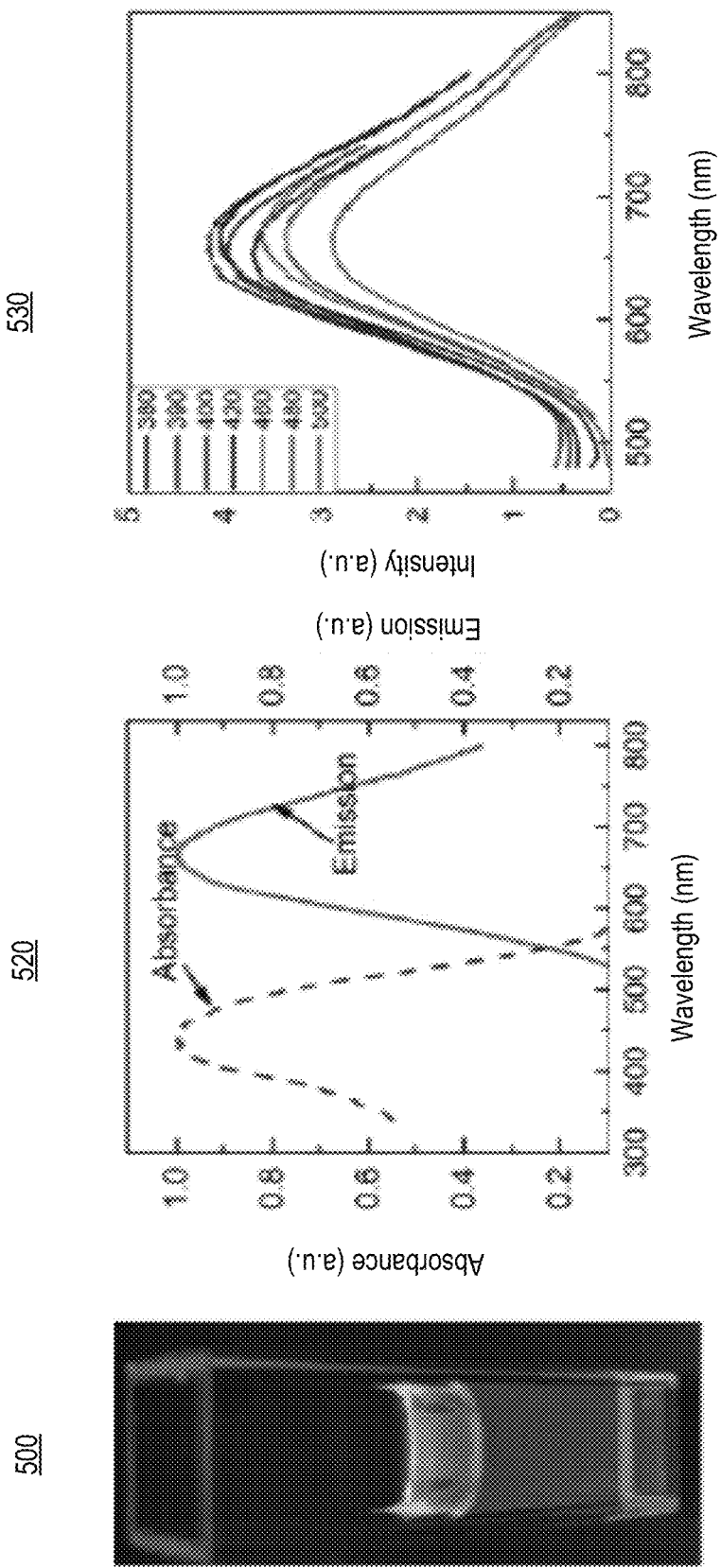

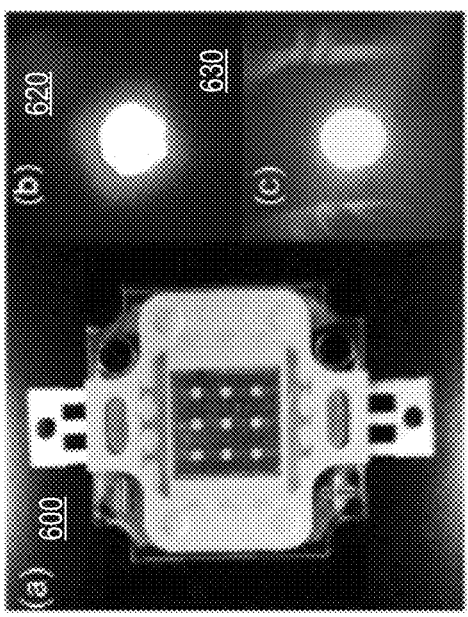
Fig. 6A-C
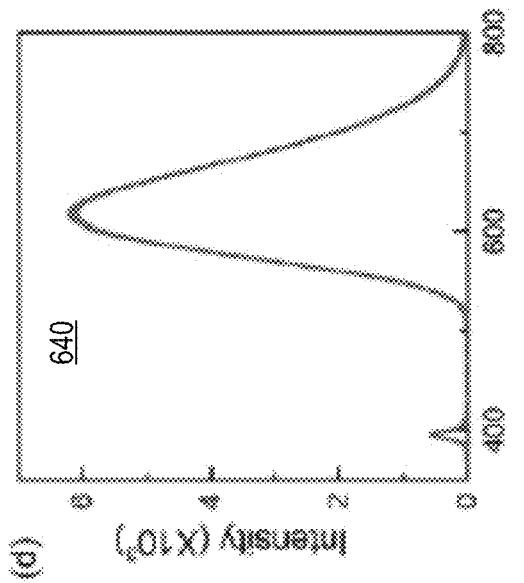
Fig. 6D
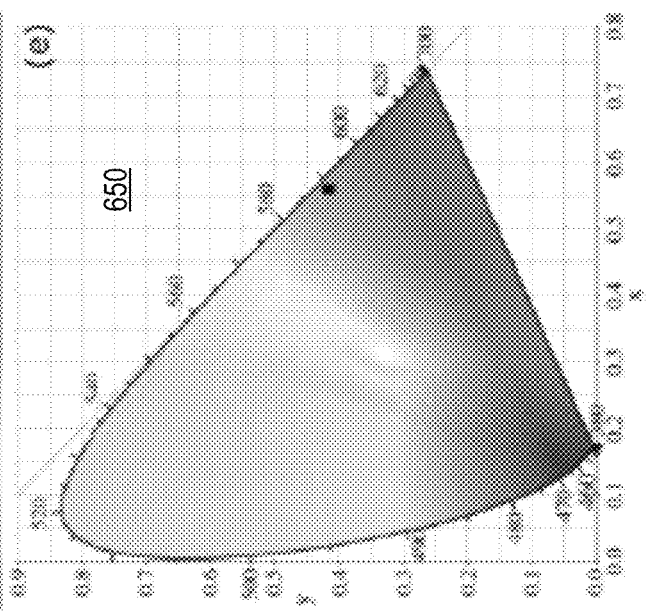
Fig. 6F
Fig. 6G
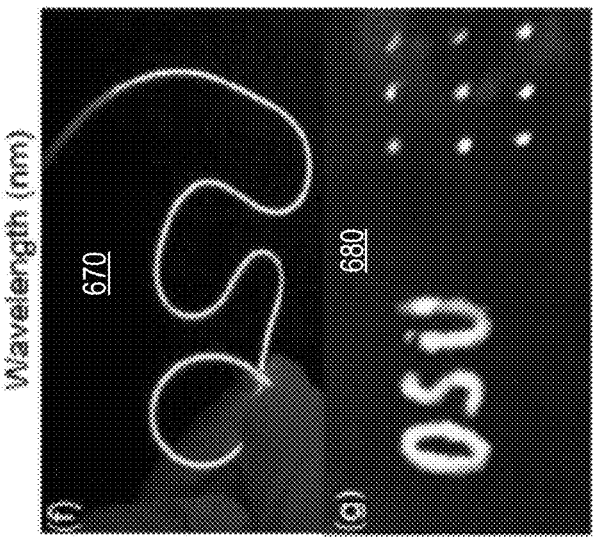
Fig. 6E

MICRO-LED APPARATUS WITH A SERIES OF CARBON-BASED LIGHT-EMITTING MATERIALS AND MANUFACTURING METHOD FOR ADJUSTING EMISSION COLORS

CLAIM FOR PRIORITY

This application is a non-provisional conversion of, and claims the benefit of priority to U.S. Provisional Patent Application No. 63/139,692, filed on Jan. 20, 2021, titled "MICRO-LED APPARATUS WITH A SERIES OF CARBON-BASED LIGHT-EMITTING MATERIALS AND MANUFACTURING METHOD FOR ADJUSTING EMISSION COLORS," and which is incorporated by reference in its entirety.

GOVERNMENT SUPPORT STATEMENT

This invention was made with government support under grant 1810067 awarded by the National Science Foundation. The government has certain rights in the invention.

BACKGROUND

Micro light emitting diode (micro-LED) display is emerging as a candidate to drive a new generation of display technology. LED based light sources are also widely used in lighting applications. It remains a challenge to develop cost-effective color conversion micro-LED technologies with enhanced light emission efficiency and minimized excitation light leakage through its color conversion layer.

BRIEF DESCRIPTION OF DRAWINGS

The embodiments of the disclosure will be understood more fully from the detailed description given below and from the accompanying drawings of various embodiments of the disclosure. However, while the drawings are to aid in explanation and understanding, they are only an aid, and should not be taken to limit the disclosure to the specific embodiments depicted therein.

FIG. 5A illustrates an optical image of the red carbon quantum dot solution under Ultra-Violet (UV) exposure, in accordance with some embodiments.

FIG. 5B illustrates a plot showing emission and absorbance spectra of the carbon-dot, in accordance with some embodiments.

FIG. 5C illustrates a plot showing emission spectra of the red carbon-dot under excitation wavelength ranging from 380 nm to 500 nm, in accordance with some embodiments.

FIG. 6A illustrates an image of a UV LED served as the excitation for wavelength conversion, in accordance with some embodiments.

FIG. 6B illustrates an image of the UV emission generated by the UV LED, in accordance with some embodiments.

FIG. 6C illustrates an image of the emission of the carbon-dot LED excited by a back UV LED, in accordance with some embodiments.

FIG. 6D illustrates a plot showing emission spectrum of the carbon-dot LED observed in FIG. 6C, in accordance with some embodiments.

FIG. 6E illustrates a CIE color coordinate of the carbon-dot LED, in accordance with some embodiments.

FIG. 6F illustrates a cured carbon-dot polymer in a tube, in accordance with some embodiments.

FIG. 6G illustrates a carbon-dot polymer pattern on a glass substrate, in accordance with some embodiments.

DETAILED DESCRIPTION OF EXEMPLARY EMBODIMENTS

Figure 1A:
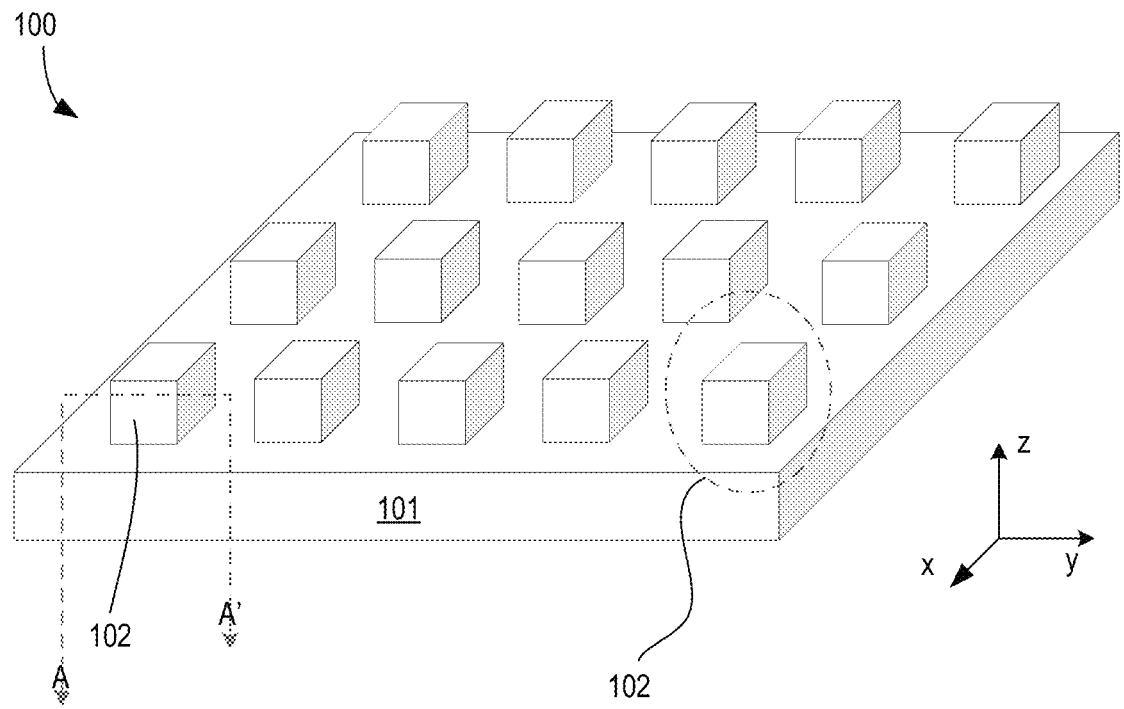
FIG. 1A illustrates a three-dimensional (3D) micro-LED array where each LED includes carbon-based light-emitting materials, in accordance with some embodiments.

Red-color carbon quantum dots (CDs) remain difficult to produce. Most of the red CDs reported to date have at least one of the following problems: (1) Incapability of efficient excitation at short wavelengths, such as blue and ultra-violet (UV) light, which limit the utility in electronic displays, e.g., micro-LEDs; (2) Low quantum yield; (3) Excitation wavelength-dependent emission color; and (4) Limited process method for material delivery and patterning.

Various embodiments describe materials and a micro-LED display with carbon-based light-emitting materials, carbon quantum dots, that are made by a solvothermal synthesis of a mixture of aromatic amino acid, 3,4-Dihydroxy-L-phenylalanine (LDOPA), and urea in dimethylformamide (DMF). In some embodiments, the mixture is heated in a sealed pressure reactor (e.g., Teflon-lined autoclave reactor, or any other suitable pressure reactor) at a temperature ranging from 120 degrees Celsius to 350 degrees Celsius, for 4-24 hours. The product is then purified to collect the solid powder. The purified CDs can be dissolved in an acrylate monomer solution or a polymer solution for material delivery and curing process on a target substrate for the applications, including light-emitting devices or sensors.

There are many technical effects of various embodiments. For example, the new type of carbon quantum dots exhibits red color emission at wavelengths in the range of 590-660 nm. Depending on the synthesis condition and surrounding media, a quantum yield greater than 30%, and a large Stoke's shift of greater than 250 nm are realized. Such quantum yield and Stoke's shift may imply that the CD has a strong excitation spectrum in the range of 390 nm to 450 nm, depending on the synthesis condition. In some embodiments, the synthesis condition can be arranged to produce the CDs with different emission colors, including green, yellow, orange and red. The carbon quantum dots can be used for different applications such as light-emitting devices, electronic displays (e.g., micro-LEDs), the fluorescence labeling in biosensors, etc. Other technical effects will be evidenced from the various embodiments and figures.

The embodiments of the disclosure will be understood more fully from the detailed description given below and from the accompanying drawings of various embodiments of the disclosure, which, however, should not be taken to limit the disclosure to the specific embodiments, but are for explanation and understanding only.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

FIG. 1A illustrates a three-dimensional (3D) micro-LED array 100 where an individual LED includes carbon-based light-emitting materials, in accordance with some embodiments. Array 100 comprises a substrate or base 101 that includes circuitry to control each LED of the array. The circuitry may include current and voltage sources that provide the bias and current to the LED that is to be excited. The circuitry can include LED drivers. In this example, a 5×3 array is illustrated. However, micro-LED array 100 can have any number of LEDs arranged in any order on substrate 101. In some embodiments, substrate 101 comprises one of silicon, silicon oxide, sapphire, aluminum gallium indium phosphide, gallium arsenide, gallium indium phosphide, silicon carbide, indium gallium nitride, gallium nitride, or silicon carbide. Array 100 can be used as a light source (e.g., LED bulb) or in a display (e.g., phone or TV display).

In some embodiments, one or more LEDs of array 100 comprise red emission carbon quantum dots 102 that are single-layer or multilayer nitrogen-doped graphene particles. In some embodiments, many single-/multi-layer carbon quantum dots 102 are embedded in a thin film deposited on each LED pixel.

Figure 1B:
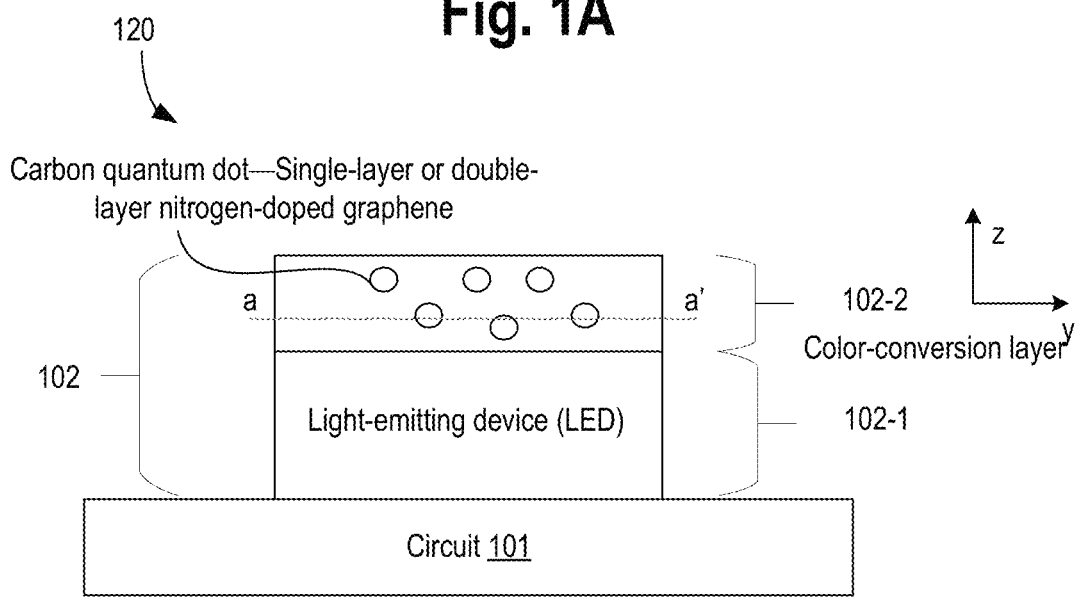
FIG. 1B illustrates a cross-section of a micro-LED of FIG. 1A, in accordance with some embodiments.

FIG. 1B illustrates a cross-section 120 of a micro-LED pixel of FIG. 1A, in accordance with some embodiments. In this example, the micro-LED pixel comprises LED 102-1 and color-conversion layer 102-2. In some embodiments, color-conversion layer 102-2 comprises the red emission carbon quantum dots which are about 5 nm (in diameter) graphene particles, and each particle comprises single or multiple layers (e.g., 4-8 graphene layers). In some embodiments, color-conversion layer 102-2 is a thin film comprising the quantum dots.

Figures 2A, 2B:
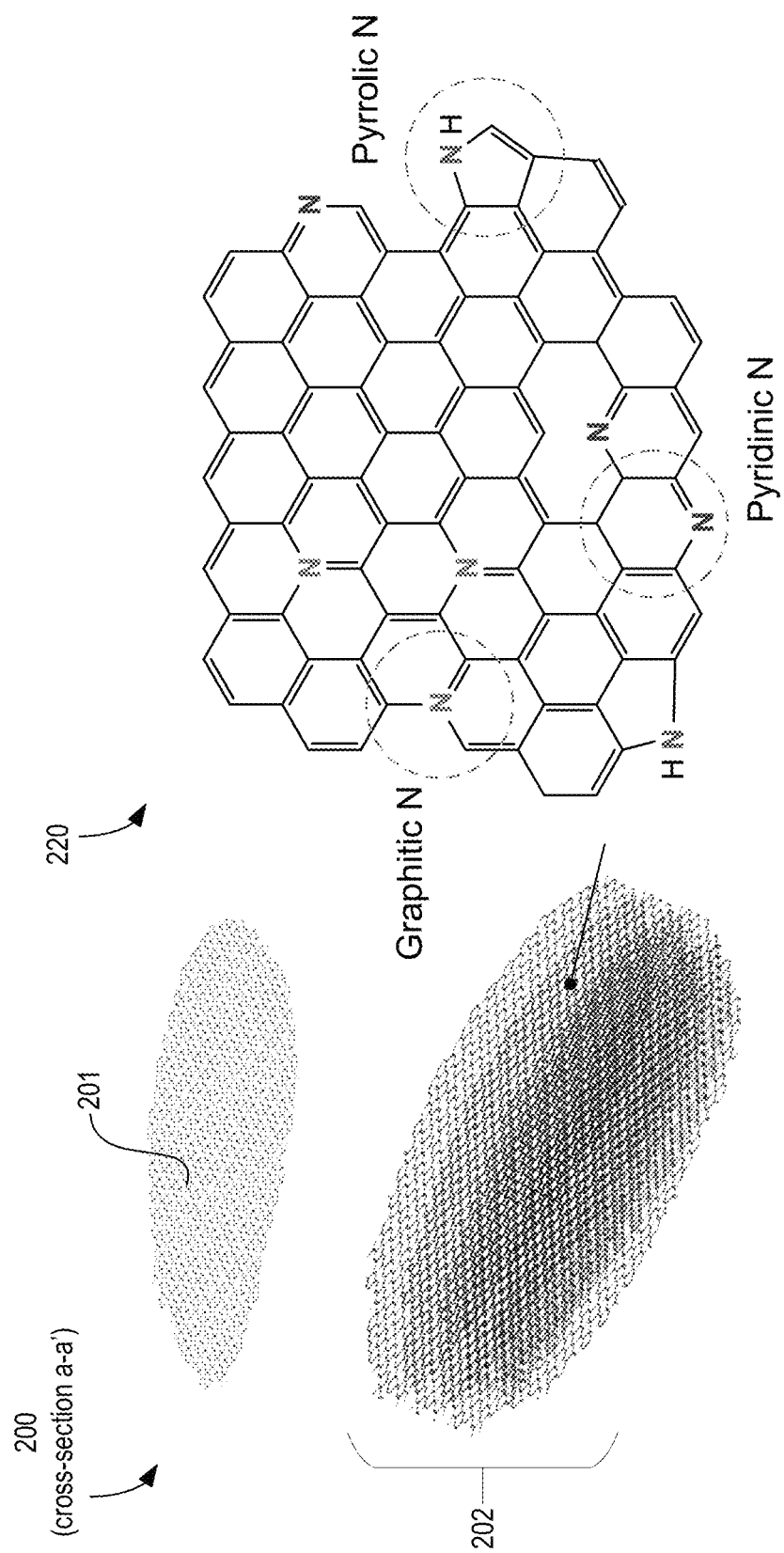
FIG. 2A illustrates a schematic drawing of a representative carbon quantum dot comprising a single layer or multiple layers of nitrogen-doped graphene, in accordance with some embodiments.
FIG. 2B illustrates a chemical structure of three types of nitrogen-doped graphene on the carbon quantum dot, in accordance with some embodiments.

FIG. 2A illustrates a schematic drawing 200 of a representative carbon quantum dot along cross-section a-a', where the carbon quantum dot comprises a single layer 201 or multiple layers 202 of nitrogen-doped graphene, in accordance with some embodiments.

FIG. 2B illustrates chemical structure 220 of three types of nitrogen-doped graphene on the carbon quantum dot, in accordance with some embodiments. The oxygens and hydrogens in the carbon quantum dot are not shown in the structure. Pyrrolic nitrogen is the nitrogen atom that contributes two p electrons to the π system and usually bonds into a five-membered ring. Pyridinic nitrogen is the nitrogen bonding with two carbon atoms at the edges or defects of graphene and contributes one p electron to the π system. Graphitic nitrogen refers to the nitrogen atom that substitutes the carbon atom and bonds to three carbon atoms in a hexagonal ring. Pyridinic N and graphitic N are $sp^2$ hybridized, while pyrrolic N is $sp^3$ hybridized.

Figure 2C:
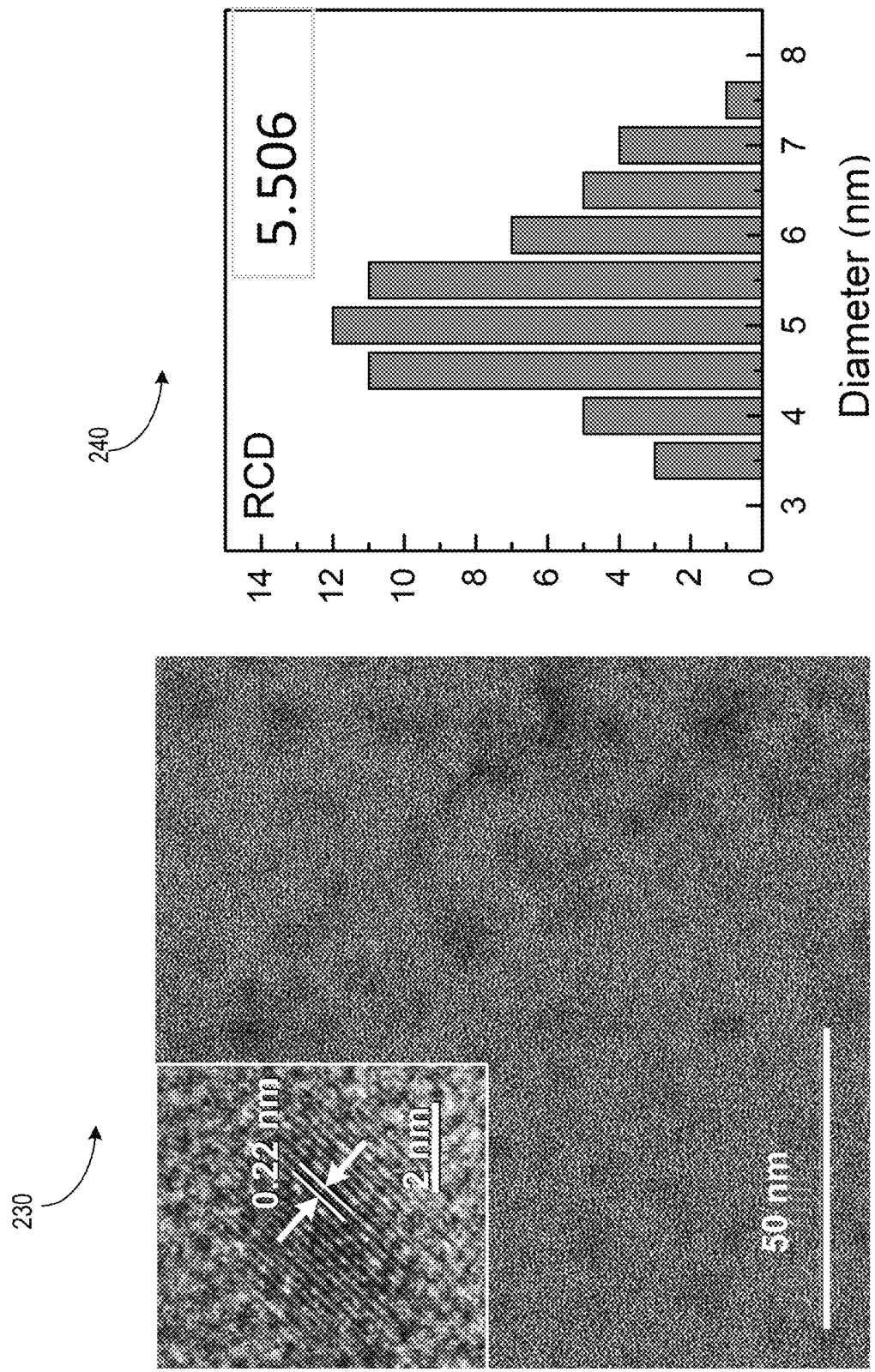
FIG. 2C illustrates a Transmission Electron Microscopy (TEM) image and size statistics of red emission carbon quantum dots, in accordance with some embodiments.

FIG. 2C illustrates a Transmission Electron Microscopy (TEM) image 230 and a plot 240 showing size statistics of red emission carbon quantum dots, in accordance with some embodiments. As shown in FIG. 2C, the carbon quantum dots exhibit uniform and monodispersed nanoparticles with an average lateral size of about 5.5 nm. The high-resolution TEM images illustrate the high crystallinity structure of carbon quantum dots with well-resolved lattice fringes. The crystal plane spacing of 0.22 nm corresponds to the (100) graphite plane.

Figure 3:
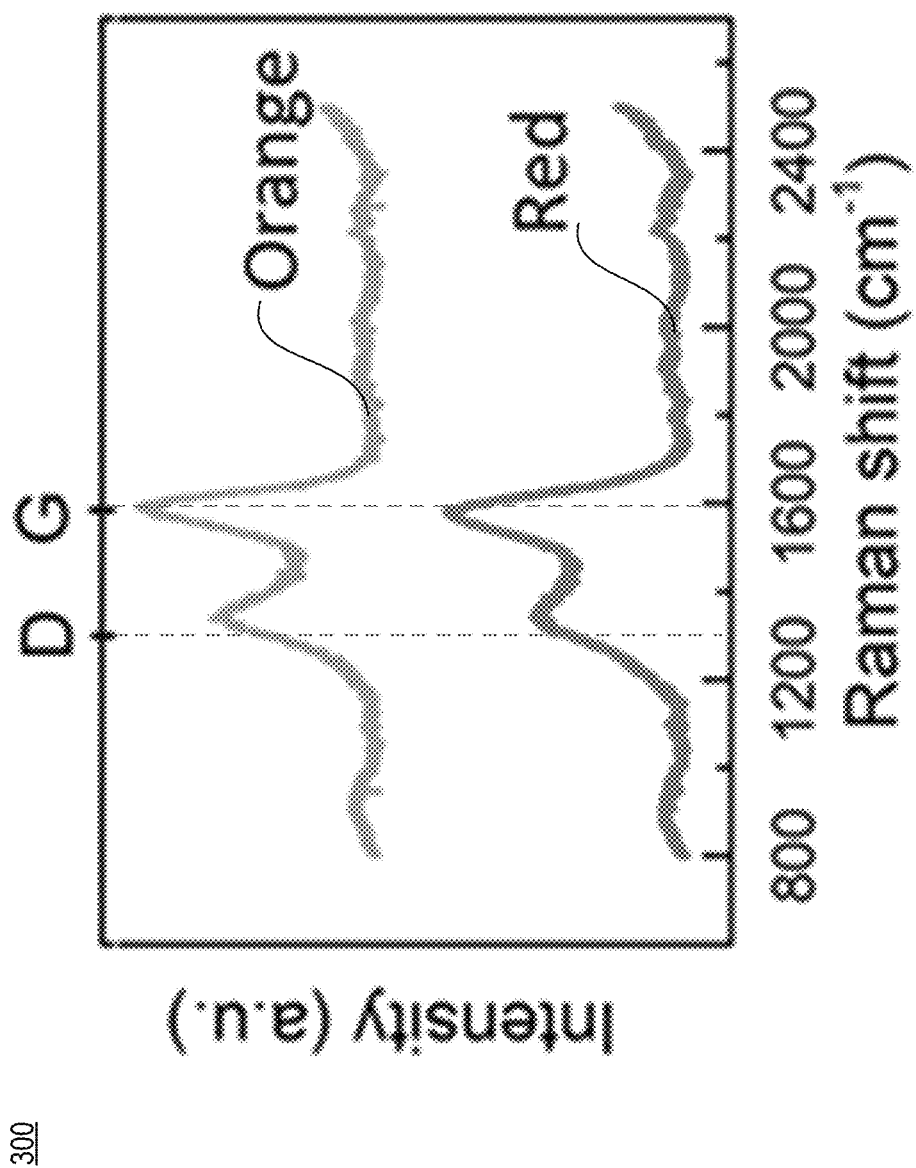
FIG. 3 illustrates a plot showing Raman spectrum of red and orange carbon quantum dots synthesized according to a method of manufacturing of some embodiments.

FIG. 3 illustrates plot 300 showing Raman spectrum of red and orange carbon quantum dots synthesized according to a method of manufacturing of some embodiments. The carbon quantum dots have a stronger G-band than D-band in Raman spectra, as shown in FIG. 3, indicating that the carbon quantum dots contain abundant sp2-hybridization. Strong graphitization rate shifts the emission spectrum to longer wavelengths. This is achieved by the solvothermal reaction of urea and 3,4-dihydroxyphenylalanine (DOPA) in dimethylformamide (DMF) solvent.

The disclosed red emission carbon quantum dots typically have a G/D band ratio (peak area) greater than 1.5. Most of the existing red carbon quantum dots have a stronger D-band than the G-band, indicating that the emission process relies on the electron transition through the defects at the edge of the carbon dot. Such material may use long-wavelength excitation and its emission color may tend to vary with the excitation wavelength. On the contrary, the carbon quantum dots of various embodiments have fewer defects. The light emission is governed by the energy bands contributed by the nitrogen dopants of specific structures.

Figure 4A:
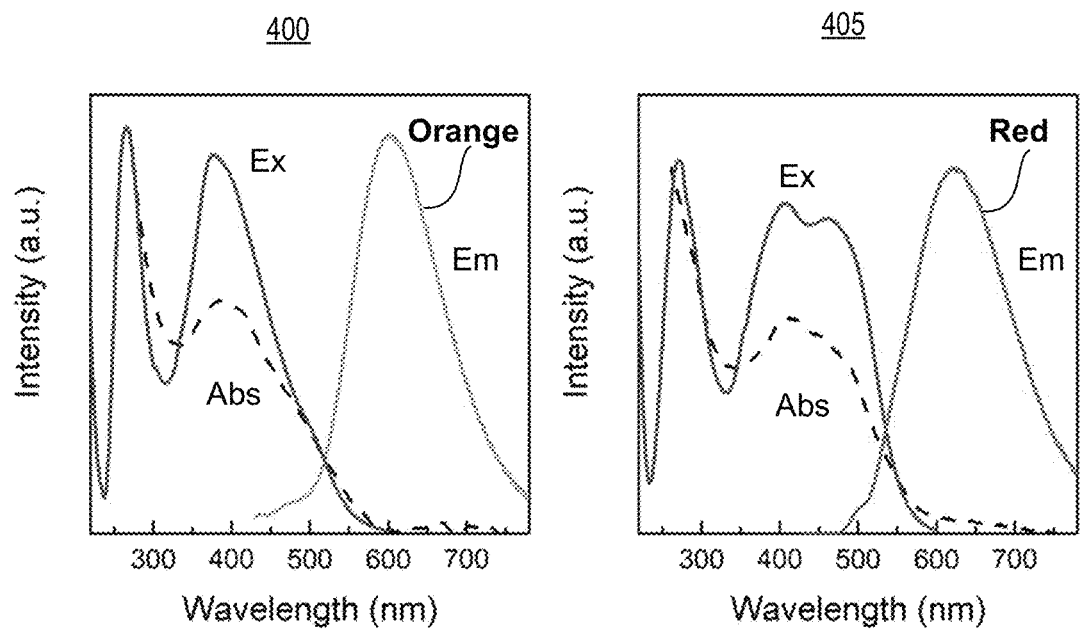
FIG. 4A illustrates a set of plots showing excitation, emission, and absorbance spectra of red and orange quantum dots, in accordance with some embodiments.

FIG. 4A illustrates plot 400 and plot 405 showing excitation, emission, and absorbance spectra of red and orange quantum dots, in accordance with some embodiments.

Figure 4B:
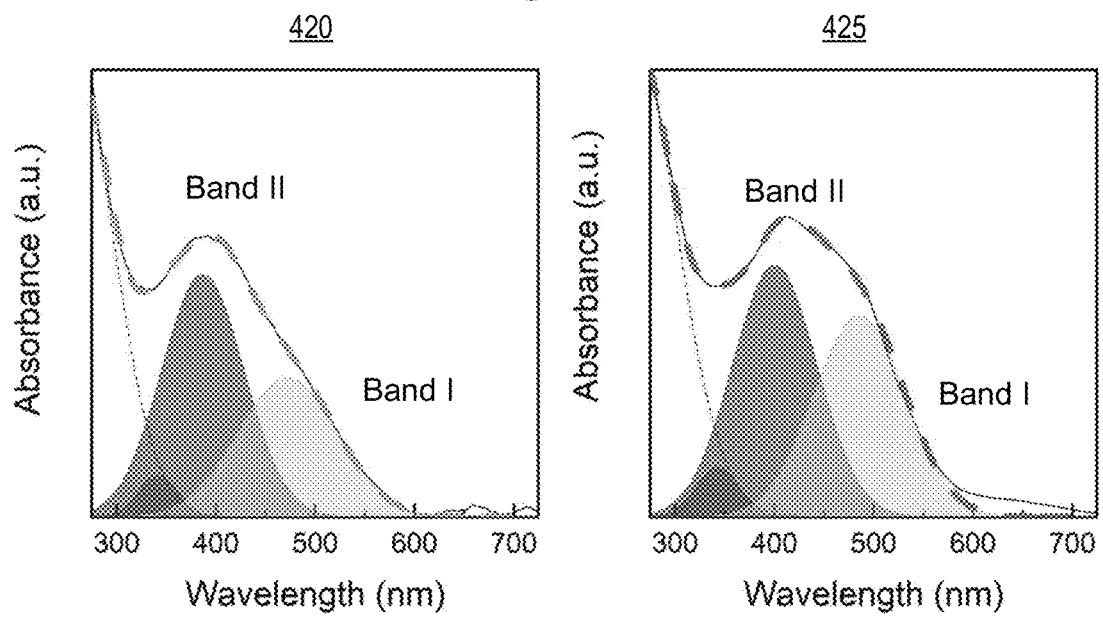
FIG. 4B illustrates a set of plots showing absorbance bands, in accordance with some embodiments.

FIG. 4B illustrates plot 420 and plot 425 showing absorbance bands, in accordance with some embodiments.

Figure 4C:
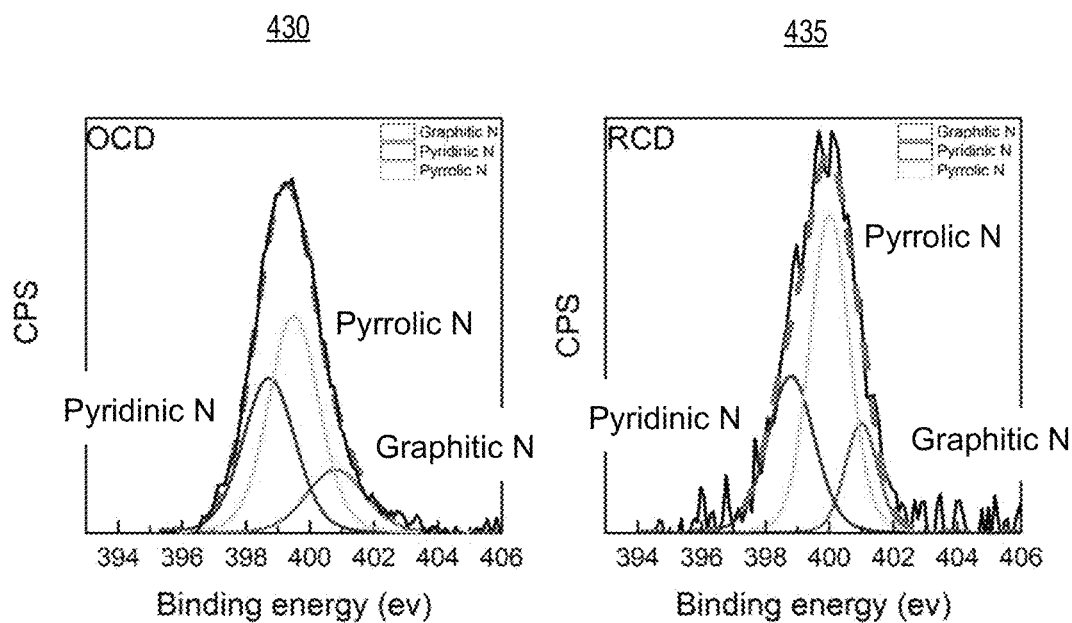
FIG. 4C illustrates a set of plots showing three different structures of nitrogen-doped graphene resolved by X-ray photoelectron spectroscopy (XPS), in accordance with some embodiments.

FIG. 4C illustrates plot 430 and plot 435 showing three different structures of nitrogen-doped graphene resolved by X-ray photoelectron spectroscopy (XPS), in accordance with some embodiments.

Figure 4D:
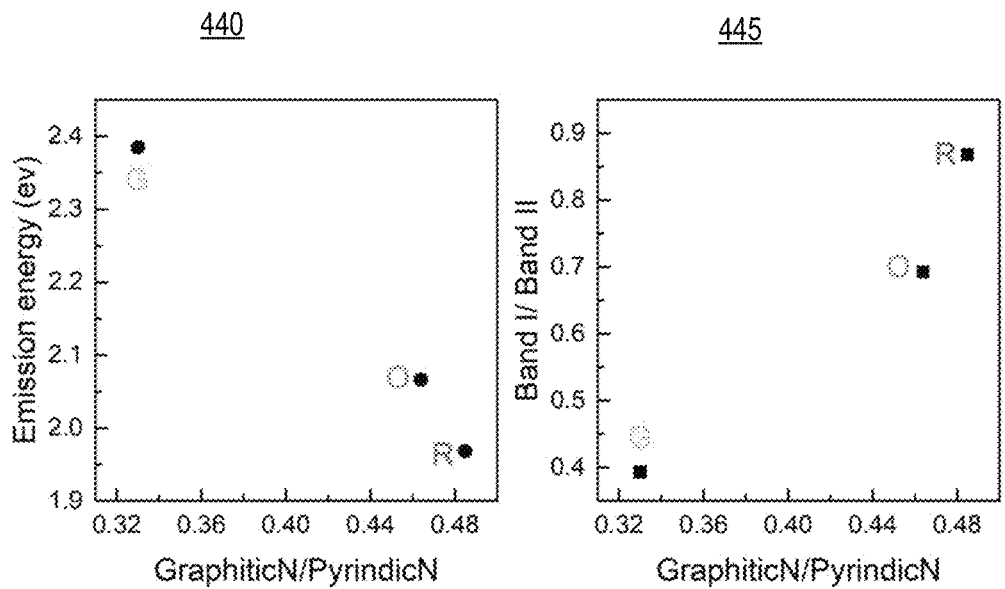
FIG. 4D illustrates a set of plots showing relationship between graphitic N to pyridinic N ratio and emission wavelength, in accordance with some embodiments.

FIG. 4D illustrates plot 440 and plot 445 showing relationship between graphitic nitrogen to pyridinic nitrogen ratio and emission wavelength, in accordance with some embodiments.

In some embodiments, among the three major structures of the nitrogen-doped graphene depicted in FIGS. 2A-B, the graphitic nitrogen structure tends to create an absorption peak around 450 nm to 550 nm wavelength (band I in FIG. 4B), resulting in red-shift in the emission spectrum (FIG. 4A). In some embodiments, pyridinic nitrogen structures contribute to an absorption band and a strong excitation peak around 400 nm (band II in FIG. 4B), allowing the carbon quantum dots to be efficiently excited at the UV and blue range. More pyridinic nitrogen also causes a blue shift in emission, in accordance with some embodiments. In some embodiments, the increased graphitic nitrogen to pyridinic nitrogen ratio is preferred to create red-color emission (FIG. 4C). In some embodiments, a sufficient amount of pyridinic nitrogen is chosen to enable efficient UV or blue excitation. The disclosed red emission carbon quantum dots of some embodiments contain nitrogen 3-10% of total elements. In some embodiments, at least 30% of the nitrogen doping is pyridinic nitrogen structure and the graphitic nitrogen to pyridinic nitrogen ratio is greater than 0.45 (FIG. 4D). Such chemical composition can be achieved by optimizing urea (carbamide) to 3,4-dihydroxyphenylalanine (DOPA) ratio for synthesis, in accordance with some embodiments.

FIG. 5A illustrates optical image 500 of the red carbon quantum dot solution under Ultra-Violet (UV) exposure, in accordance with some embodiments. FIG. 5B illustrates plot 520 showing emission and absorbance spectra of the carbon-dot, in accordance with some embodiments. FIG. 5C illustrates plot 530 showing emission spectra of the red carbon-dot under excitation wavelength ranging from 380 nm to 500 nm, in accordance with some embodiments.

The emission and absorbance measurement in FIG. 5B show an emission peak at 660 nm and excitation peak of 430 nm. The large 230 nm Stoke shift (wavelength difference between excitation and emission peaks) implies that the CD can be efficiently excited by blue and UV light (390 nm-480 nm). FIG. 5C shows negligible shift in the emission wavelength under different excitation wavelengths, ranging from 380 nm-500 nm.

FIG. 6A illustrates an image of a UV LED 600 served as the excitation for wavelength conversion, in accordance with some embodiments.

FIG. 6B illustrates an image 620 of the UV emission generated by the UV LED, in accordance with some embodiments.

FIG. 6C illustrates an image 630 of the emission of the carbon-dot LED excited by a back UV LED, in accordance with some embodiments.

FIG. 6D illustrates a plot 640 showing emission spectrum of the carbon-dot LED observed in FIG. 6C, in accordance with some embodiments.

FIG. 6E illustrates a CIE color coordinate 650 of the carbon-dot LED, in accordance with some embodiments.

FIG. 6F illustrates a cured carbon-dot polymer 660 in a tube, in accordance with some embodiments.

FIG. 6G illustrates a carbon-dot polymer pattern 670 on a glass substrate, in accordance with some embodiments.

FIGS. 6A-G summarize the characterization of a micro-LED using the carbon-based light-emitting materials. FIG. 6A and FIG. 6B show the image of the UV LED and the UV emission for the excitation the CD layer. FIGS. 6C-E show the image, emission spectrum, and CIE color coordinate of the emitting CD layer excited by the UV LED backlight. The CD prepolymer can be printed and cured on multiple types of substrates for different applications, as shown in FIG. 6F and FIG. 6G.

Figure 7:
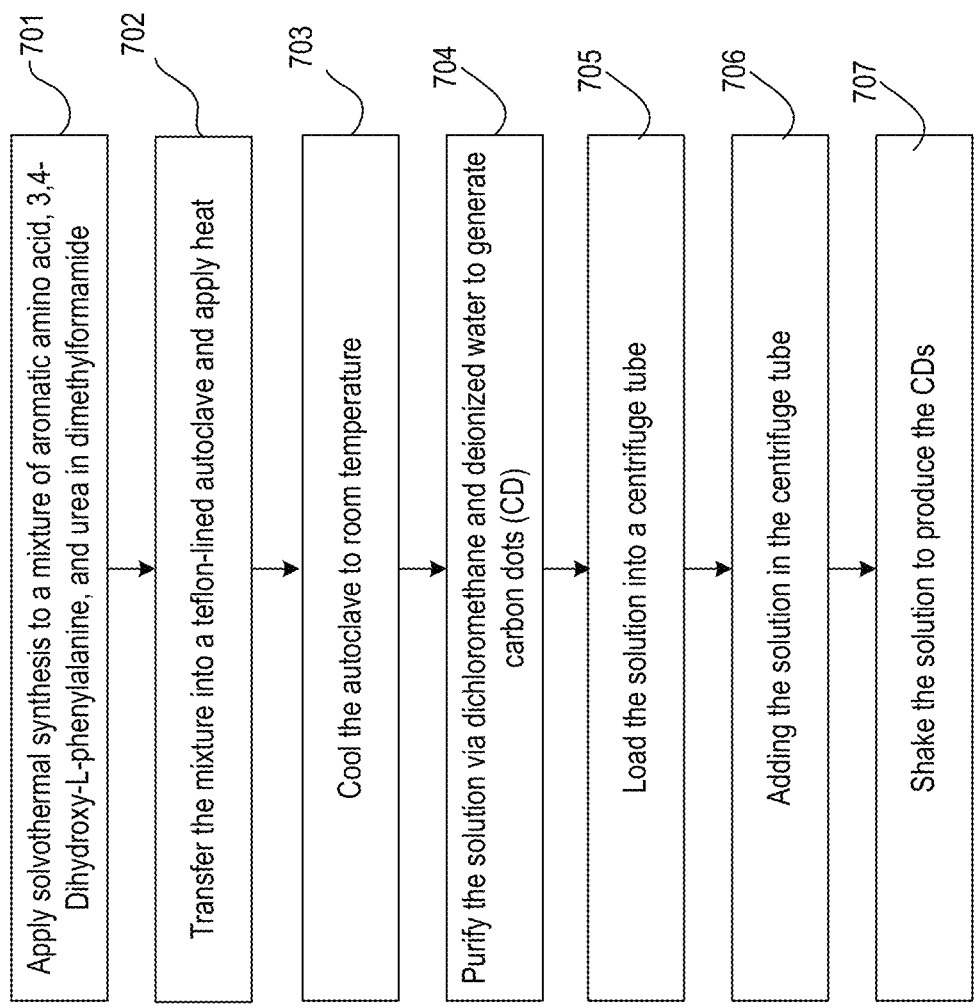
FIG. 7 illustrates a flowchart of a method forming an LED with carbon-based light-emitting materials, in accordance with some embodiments.

FIG. 7 illustrates flowchart 700 of a method forming an LED with carbon-based light-emitting materials, in accordance with some embodiments. While the blocks in the flowchart are shown in a particular order, the order can be changed. For example, some bocks or operations can be performed before others while some can be performed in parallel.

At block 701, the carbon quantum dots (CDs) are made by applying a solvothermal synthesis of a mixture of aromatic amino acid, 3,4-dihydroxy-L-phenylalanine (L-DOPA), and urea in dimethylformamide (DMF). At block 702, the mixture is transferred into a Teflon-lined pressure reactor (e.g., autoclave reactor, or any other suitable pressure reactor) and heated at 200° C. for 8 hrs. At block 703, after the reaction, the reactor is cooled to room temperature. At block 704, in some embodiments, the thermal process of heating in the synthesis may be realized using a microwave reactor. The solution is purified via water-immiscible organic solvent, such as dichloromethane and chloroform, and deionized water (DIW) to provide carbon dots. The resultant of this purification is the carbon dots powder.

At block 705, the solution is loaded to a centrifuge tube. At block 706, dichloromethane and the de-ionized water is added to the centrifuge tube. At block 707, the solution in the centrifuge tube is shaken to produce a red-black powder at the interface between organic and aqueous phases, wherein the red-black powder produces the carbon dots. In some embodiments, the powder of carbon dots are disclosed in an acrylate monomer liquid (e.g., acrylate monomer liquid comprises N,N-dimethylacrylamide (DMAA)). In some embodiments, acrylate monomer liquid comprises one of: ethylene glycol dimethacrylate (EDGMA), poly(ethylene glycol) diacrylate (PEGDA), trimethylolpropane trimethacrylate (TRIM)) or photoinitiator. In some embodiments, the photoinitiator comprises one of: azobisisobutyronitrile (AIBN), 2-hydroxy-2-methylpropiophenone-based or benzophenone-based photoinitiators. In some embodiments, a crosslinker is added to the acrylate monomer liquid to form a CD-prepolymer liquid. In some embodiments, the CD-prepolymer liquid is delivered to a substrate. In some embodiments, the delivered CD-prepolymer liquid is cured.

In one example, the as-prepared CD solution is loaded into a 15 ml centrifuge tube and added with dichloromethane and the de-ionized water (DIW). After agitated shaking, as indicated by, the mixture is centrifuged at 8000 rpm for 8 minutes to achieve phase separation. The purification process starts with taking the organic phase liquid to mix with DIW. After a strong agitation and 8000 rpm centrifuge for 8 min, a red-black powder precipitates at the interface between the organic and aqueous phases. The purification process is then repeated multiple times and collects the precipitated CD product. The CD powder is dried under the 70° C., for 1-2 hours under the atmospheric pressure.

The CD can be used as the emitting material of micro-LED. One of the methods to process the material is to dissolve the CD powder in an acrylate monomer liquid, such as N,N-dimethylacrylamide (DMAA), and add to a mixture containing at least one crosslinker (e.g., ethylene glycol dimethacrylate (EDGMA), poly(ethylene glycol) diacrylate (PEGDA), polyurethane acrylates and trimethylolpropane trimethacrylate (TRIM)) and photoinitiator (e.g., azobisisobutyronitrile (AIBN), 2-hydroxy-2-methylpropiophenone-based or benzophenone-based photoinitiators). In some embodiments, the CD-prepolymer mixture can be delivered to the substrate using printing methods, transfer or spin-coating and cured under UV exposure or thermal treatment.

Figure 8:
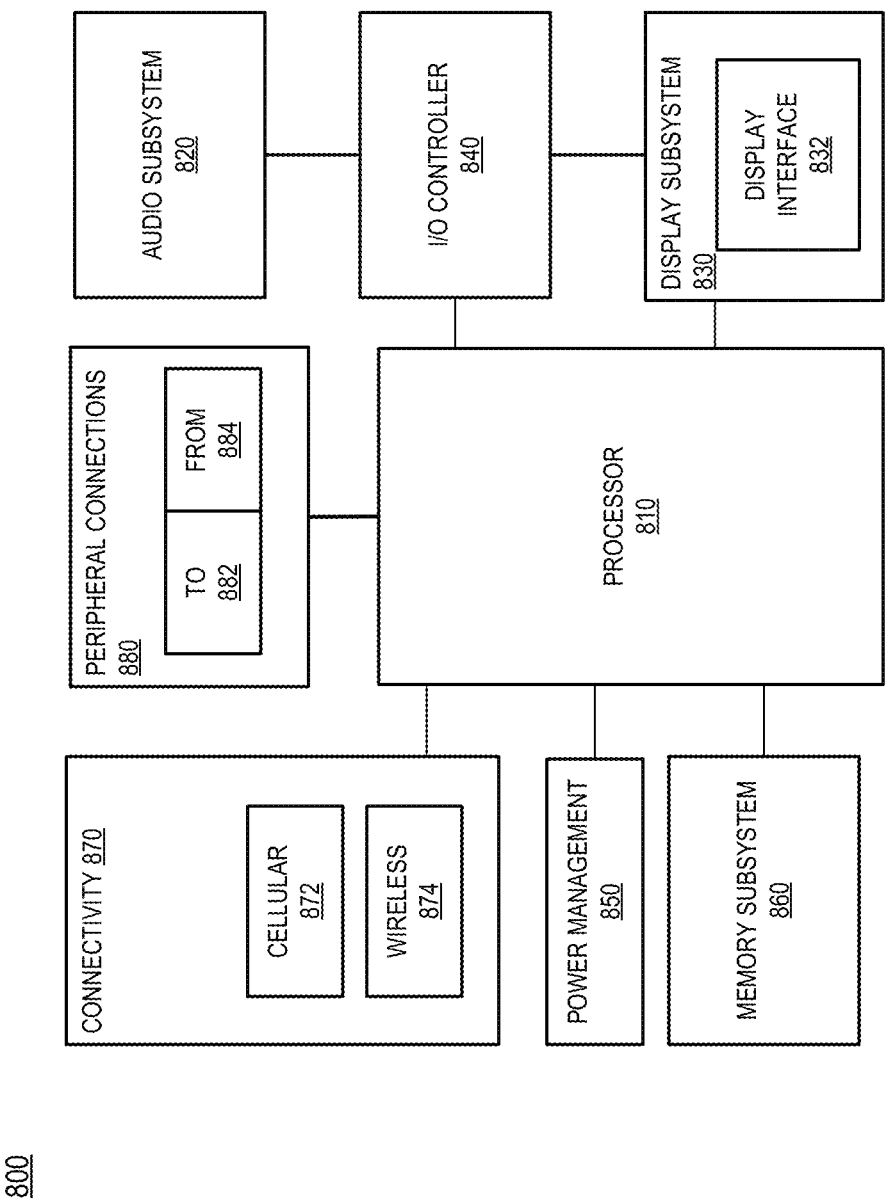
FIG. 8 illustrates a computer system communicatively coupled with a display having micro-LED array where each LED includes carbon-based light-emitting materials, in accordance with some embodiments.

FIG. 8 illustrates a computer system communicatively coupled with a display having micro-LED array where each LED includes carbon-based light-emitting materials, in accordance with some embodiments. In some embodiments, computing device 800 represents an appropriate computing device, such as a computing tablet, a mobile phone or smart-phone, a laptop, a desktop, an Internet-of-Things (IOT) device, a server, a set-top box, a wireless-enabled e-reader, or the like. It will be understood that certain components are shown generally, and not all components of such a device are shown in computing device 800.

In some embodiments, computing device 800 includes a processor 810. The various embodiments of the present disclosure may also comprise a network interface within 870 such as a wireless interface so that a system embodiment may be incorporated into a wireless device, for example, cell phone or personal digital assistant.

In one embodiment, processor 810 can include one or more physical devices, such as microprocessors, application processors, microcontrollers, programmable logic devices, or other processing means. The processing operations performed by processor 810 include the execution of an operating platform or operating system on which applications and/or device functions are executed. The processing operations include operations related to I/O (input/output) with a human user or with other devices, operations related to power management, and/or operations related to connecting the computing device 800 to another device. The processing operations may also include operations related to audio I/O and/or display I/O.

In one embodiment, computing device 800 includes audio subsystem 820, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 800, or connected to the computing device 800. In one embodiment, a user interacts with the computing device 800 by providing audio commands that are received and processed by processor 810.

Display subsystem 830 represents hardware (e.g., display devices) and software (e.g., drivers) components that provide a visual and/or tactile display for a user to interact with the computing device 800. Display subsystem 830 includes display interface 832, which includes the particular screen or hardware device used to provide a display to a user. In one embodiment, display interface 832 includes logic separate from processor 810 to perform at least some processing related to the display. In one embodiment, display subsystem 830 includes a touch screen (or touch pad) device that provides both output and input to a user.

I/O controller 840 represents hardware devices and software components related to interaction with a user. I/O controller 840 is operable to manage hardware that is part of audio subsystem 820 and/or display subsystem 830. Additionally, I/O controller 840 illustrates a connection point for additional devices that connect to computing device 800 through which a user might interact with the system. For example, devices that can be attached to the computing device 800 might include microphone devices, speaker or stereo systems, video systems or other display devices, keyboard or keypad devices, or other I/O devices for use with specific applications such as card readers or other devices.

As mentioned above, I/O controller 840 can interact with audio subsystem 820 and/or display subsystem 830. For example, input through a microphone or other audio device can provide input or commands for one or more applications or functions of the computing device 800. Additionally, audio output can be provided instead of, or in addition to display output. In another example, if display subsystem 830 includes a touch screen, the display device also acts as an input device, which can be at least partially managed by I/O controller 840. There can also be additional buttons or switches on the computing device 800 to provide I/O functions managed by I/O controller 840.

In one embodiment, I/O controller 840 manages devices such as accelerometers, cameras, light sensors or other environmental sensors, or other hardware that can be included in the computing device 800. The input can be part of direct user interaction, as well as providing environmental input to the system to influence its operations (such as filtering for noise, adjusting displays for brightness detection, applying a flash for a camera, or other features).

In one embodiment, computing device 800 includes power management 850 that manages battery power usage, charging of the battery, and features related to power saving operation. Memory subsystem 860 includes memory devices for storing information in computing device 800. Memory can include nonvolatile (state does not change if power to the memory device is interrupted) and/or volatile (state is indeterminate if power to the memory device is interrupted) memory devices. Memory subsystem 860 can store application data, user data, music, photos, documents, or other data, as well as system data (whether long-term or temporary) related to the execution of the applications and functions of the computing device 800.

Elements of embodiments are also provided as a machine-readable medium (e.g., memory 860) for storing the computer-executable instructions (e.g., instructions to implement any other processes discussed herein). The machine-readable medium (e.g., memory 860) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 870 includes hardware devices (e.g., wireless and/or wired connectors and communication hardware) and software components (e.g., drivers, protocol stacks) to enable the computing device 800 to communicate with external devices. The computing device 800 could be separate devices, such as other computing devices, wireless access points or base stations, as well as peripherals such as headsets, printers, or other devices.

Connectivity 870 can include multiple different types of connectivity. To generalize, the computing device 800 is illustrated with cellular connectivity 872 and wireless connectivity 874. Cellular connectivity 872 refers generally to cellular network connectivity provided by wireless carriers, such as provided via LTE (long term evolution), LTE 4G, LTE 5G, GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 874 refers to wireless connectivity that is not cellular, and can include personal area networks (such as Bluetooth, Near Field, etc.), local area networks (such as Wi-Fi), and/or wide area networks (such as LTE), or other wireless communication.

Peripheral connections 880 include hardware interfaces and connectors, as well as software components (e.g., drivers, protocol stacks) to make peripheral connections. It will be understood that the computing device 800 could both be a peripheral device ("to" 882) to other computing devices, as well as have peripheral devices ("from" 884) connected to it. The computing device 800 commonly has a "docking" connector to connect to other computing devices for purposes such as managing (e.g., downloading and/or uploading, changing, synchronizing) content on computing device 800. Additionally, a docking connector can allow computing device 800 to connect to certain peripherals that allow the computing device 800 to control content output, for example, to audiovisual or other systems.

In addition to a proprietary docking connector or other proprietary connection hardware, the computing device 800 can make peripheral connections 880 via common or standards-based connectors. Common types can include a Universal Serial Bus (USB) connector (which can include any of a number of different hardware interfaces), DisplayPort including MiniDisplayPort (MDP), High-Definition Multimedia Interface (HDMI), Firewire, USB Type-C. or other types.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "analog signal" refers to any continuous signal for which the time varying feature or variable of the signal is a representation of some other time varying quantity (e.g., analogous to another time varying signal).

The term "digital signal" refers to a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims. Where specific details are set forth in order to describe example embodiments of the disclosure, it should be apparent to one skilled in the art that the disclosure can be practiced without, or with variation of, these specific details. The description is thus to be regarded as illustrative instead of limiting.

The following examples presented as claims pertain to further embodiments. Specifics in the examples may be used anywhere in one or more embodiments. All optional features of the apparatus described herein may also be implemented with respect to a method or process.

Example 1: An apparatus comprising: a substrate; a light-emitting device on the substrate; and a plurality of red emission carbon quantum dots on the light-emitting device, wherein an individual red emission carbon quantum dot, of the plurality of red emission carbon quantum dots, comprises a single-layer or multi-layer of nitrogen-doped graphene particles.

Example 2: The apparatus of example 1, wherein the nitrogen-doped graphene particles are about 5 nm in diameter.

Example 3: The apparatus of example 1, wherein at least one particle in the multi-layer comprises four graphene layers.

Example 4: The apparatus of example 1, wherein the individual red emission carbon quantum dot has a ratio of G-band to D-band greater than 1.5.

Example 5: The apparatus of example 1, wherein the individual red emission carbon quantum dot comprises a graphitic nitrogen structure that creates an absorption peak about 450 nm to 550 nm wavelength.

Example 6: The apparatus of example 1, wherein the individual red emission carbon quantum dot comprises pyridinic nitrogen structure that creates an absorption peak around 400 nm wavelength.

Example 7: The apparatus of example 1, wherein the individual red emission carbon quantum dot comprises nitrogen 3% to 10% to total elements in the individual red emission carbon quantum dot.

Example 8: The apparatus of example 1, wherein the individual red emission carbon quantum dot comprises a graphitic nitrogen structure and pyridinic nitrogen structure, wherein a ratio of the graphitic nitrogen structure to the pyridinic nitrogen structure is greater than 0.45.

Example 9: A method comprising: applying solvothermal synthesis of a mixture of aromatic amino acid, 3,4-dihydroxy-L-phenylalanine (L-DOPA), and urea in dimethylformamide (DMF); transferring the mixture to a pressure reactor; cooling the pressure reactor to room temperature after a reaction in the pressure reactor, wherein the reaction generates a solution; and purifying the solution via water-immiscible organic solvent and deionized water to provide carbon dots.

Example 10: The method of example 9, wherein the pressure reactor is heated at about 200 Celsius for about 8 hours.

Example 11: The method of example 9, wherein the water-immiscible organic solvent comprises one of: dichloromethane or chloroform.

Example 12: The method of example 9 comprising: loading the solution into a centrifuge tube; adding dichloromethane and the deionized water in the centrifuge tube; and shaking the solution in the centrifuge tube to produce a red-black powder at an interface between organic and aqueous phases, wherein the red-black powder produces the carbon dots.

Example 13: The method of example 9 comprising: dissolving a powder of carbon dots in an acrylate monomer liquid; adding a crosslinker to the acrylate monomer liquid to form a CD-prepolymer liquid; delivering the CD-prepolymer liquid to a substrate; and curing the delivered CD-prepolymer liquid.

Example 14: The method of example 13, wherein the acrylate monomer liquid comprises N,N-dimethylacrylamide (DMAA).

Example 15: The method of example 13, wherein the acrylate monomer liquid comprises one of: ethylene glycol dimethacrylate (EDGMA), poly(ethylene glycol) diacrylate (PEGDA), trimethylolpropane trimethacrylate (TRIM)), or photoinitiator.

Example 16: The method of example 13, wherein when the acrylate monomer liquid is a photoinitiator, the photoinitiator comprises one of: azobisisobutyronitrile (AIBN), 2-hydroxy-2-methylpropiophenone-based photoinitiators, or benzophenone-based photoinitiators.

Example 17: A system comprising: a processor circuitry to execute instructions; a memory coupled to the processor circuitry, wherein the memory is to store the instructions; and a display communicatively coupled to the processor circuitry, wherein the display includes: a substrate; a light-emitting device on the substrate; and a plurality of red emission carbon quantum dots on the light-emitting device, wherein an individual red emission carbon quantum dot, of the plurality of red emission carbon quantum dots, comprises a single-layer or multi-layer of nitrogen-doped graphene particles.

Example 18: The system of example 17, wherein the nitrogen-doped graphene particles are about 5 nm in diameter.

Example 19: The system of example 17, wherein at least one particle in the multi-layer comprises four graphene layers.

Example 20: The system of example 17, wherein: the individual red emission carbon quantum dot comprises a graphitic nitrogen structure that creates an absorption peak about 450 nm to 550 nm wavelength; the individual red emission carbon quantum dot comprises pyridinic nitrogen structure that creates an absorption peak around 400 nm wavelength; the individual red emission carbon quantum dot comprises nitrogen 3% to 10% to total elements in the individual red emission carbon quantum dot; or the individual red emission carbon quantum dot comprises a graphitic nitrogen structure and pyridinic nitrogen structure, wherein a ratio of the graphitic nitrogen structure to the pyridinic nitrogen structure is greater than 0.45.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
   a substrate;
   a light-emitting device on the substrate; and a plurality of red emission carbon quantum dots on the light-emitting device, wherein an individual red emission carbon quantum dot, of the plurality of red emission carbon quantum dots, comprises a single-layer or multi-layer of nitrogen-doped graphene particles.

2. The apparatus of claim 1, wherein the nitrogen-doped graphene particles are about 5 nm in diameter.

3. The apparatus of claim 1, wherein at least one particle in the multi-layer comprises four graphene layers.

4. The apparatus of claim 1, wherein the individual red emission carbon quantum dot has a ratio of G-band to D-band greater than 1.5.

5. The apparatus of claim 1, wherein the individual red emission carbon quantum dot comprises a graphitic nitrogen structure that creates an absorption peak about 450 nm to 550 nm wavelength.

6. The apparatus of claim 1, wherein the individual red emission carbon quantum dot comprises pyridinic nitrogen structure that creates an absorption peak around 400 nm wavelength.

7. The apparatus of claim 1, wherein the individual red emission carbon quantum dot comprises nitrogen 3% to 10% to total elements in the individual red emission carbon quantum dot.

8. The apparatus of claim 1, wherein the individual red emission carbon quantum dot comprises a graphitic nitrogen structure and pyridinic nitrogen structure, and wherein a ratio of the graphitic nitrogen structure to the pyridinic nitrogen structure is greater than 0.45.

9. A system comprising:
a processor circuitry to execute instructions;
a memory coupled to the processor circuitry, wherein the memory is to store the instructions; and
a display communicatively coupled to the processor circuitry, wherein the display includes:
a substrate;
a light-emitting device on the substrate; and
a plurality of red emission carbon quantum dots on the light-emitting device, wherein an individual red emission carbon quantum dot, of the plurality of red emission carbon quantum dots, comprises a single-layer or multi-layer of nitrogen-doped graphene particles.

10. The system of claim 9, wherein the nitrogen-doped graphene particles are about 5 nm in diameter.

11. The system of claim 9, wherein at least one particle in the multi-layer comprises four graphene layers.

12. The system of claim 9, wherein:
the individual red emission carbon quantum dot comprises a graphitic nitrogen structure that creates an absorption peak about 450 nm to 550 nm wavelength;
the individual red emission carbon quantum dot comprises a pyridinic nitrogen structure that creates an absorption peak around 400 nm wavelength;
the individual red emission carbon quantum dot comprises nitrogen 3% to 10% to total elements in the individual red emission carbon quantum dot; or
the individual red emission carbon quantum dot comprises the graphitic nitrogen structure and the pyridinic nitrogen structure, wherein a ratio of the graphitic nitrogen structure to the pyridinic nitrogen structure is greater than 0.45.

* * * * *